United States Patent
Choi

(10) Patent No.: US 6,696,984 B2
(45) Date of Patent: Feb. 24, 2004

(54) APPARATUS AND METHOD FOR SENSING ROTARY SWITCH HANDLING DIRECTION OF MONITOR

(75) Inventor: Yong Seog Choi, Kyongsangbuk-do (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 10/418,115

(22) Filed: Apr. 18, 2003

(65) Prior Publication Data

US 2003/0210161 A1 Nov. 13, 2003

Related U.S. Application Data

(62) Division of application No. 09/923,330, filed on Aug. 8, 2001, now Pat. No. 6,606,036.

(30) Foreign Application Priority Data

Aug. 9, 2000 (KR) .......................................... 2000-46183

(51) Int. Cl.[7] ................................................. H03M 1/22
(52) U.S. Cl. ............................................. 341/6; 341/13
(58) Field of Search ....................... 341/6, 13; 381/109, 381/104

(56) References Cited

U.S. PATENT DOCUMENTS

| | | | | | |
|---|---|---|---|---|---|
| 4,782,262 A | * | 11/1988 | Kiyo-Oka | ............... | 310/323.02 |
| 5,513,268 A | * | 4/1996 | Bironas et al. | ............. | 381/109 |
| 6,275,173 B1 | * | 8/2001 | Wu | ............................. | 341/13 |

* cited by examiner

*Primary Examiner*—Peguy JeanPierre
(74) *Attorney, Agent, or Firm*—Jacobson Holman PLLC

(57) ABSTRACT

An apparatus and method for sensing a rotary switch handling direction of a monitor is disclosed, in which a simple configuration can be obtained and accuracy in sensing a handling direction can be enhanced. The apparatus for sensing a rotary switch handling direction of a monitor includes a rotary switch for outputting voltage levels varied correspondingly depending on a user's handling direction, and a microcomputer for storing the voltage levels output from the rotary switch and comparing the voltage levels with a previously stored voltage change/handling direction table to determine a handling direction of the rotary switch. Since the handling direction is sensed by the voltage level difference for respective contacts, it is possible to exactly sense the handling direction and to relatively obtain a simple configuration.

4 Claims, 4 Drawing Sheets

APPARATUS AND METHOD FOR SENSING ROTARY SWITCH HANDLING DIRECTION OF MONITOR

This is a divisional application of prior application Ser. No. 09/923,330 filed Aug. 8, 2001, is now a U.S. Pat. No. 6,606,036.

BACKGROUND OF THE INVENTION

1. Field of the Invention

The present invention relates to a monitor, and more particularly, to an apparatus and method for sensing a rotary switch handling direction of a monitor.

2. Background of the Related Art

Generally, with development of computer software, high picture quality is required for a monitor. However, the monitor has several problems, such as balancing error, focusing error, and color purity error, in controlling and adjusting a screen. With a large sized screen of a monitor, the above problems are becoming more serious.

Accordingly, a monitor is provided with a compensating means that compensates such problems. As an example of the compensating means, a plurality of switches for adjusting a screen are provided in a predetermined region of the monitor. When the switches are provided to compensate errors for a plurality of screen adjusting modes, problems arise in that it is not easy for a user to handle a desired switch and the screen may incorrectly be adjusted.

To solve such problems, there has been provided a rotary switch that can select desired screen adjusting modes by allowing a user to rotate the switch. A related art rotary switch will be described with reference to FIGS. 1 to 3.

As shown in FIG. 1, the related art rotary switch includes a fixed disc 22 and a rotary disc 24. The rotary disc 24 overlaps the fixed disc 22 and rotates around a common shaft 26 relative to the fixed disc 22.

The fixed disc 22 includes a plurality of conductor pads 28 arranged to have the same angle around the common shaft 26. The rotary disc 24 includes two switches SWA and SWB. The switches SWA and SWB are fixed on the rotary disc 24 and arranged at angles with each other at a predetermined angle along a circular trace of the rotary disc 24.

A circuit configuration of the related art rotary switch will be described with reference to FIG. 2.

As shown in FIG. 2, the circuit of the related art rotary switch includes switches SWA and SWB, a resistor R1, a capacitor C, and a switch SWU. Each of the switches SWA and SWB has one end supplied with a power source of 5 V through a resistor R2 and the other end commonly grounded. The resistor R1 and the capacitor C are connected in series between both ends of the respective switches SWA and SWB to form each loop of the switches SWA and SWB. The switch SWU is commonly grounded with the other ends of the switches SWA and SWB and has one end connected with a CPU of the monitor. The circuit of the related art rotary switch further includes a pulse generator (not shown) for respectively generating predetermined pulses when the switches SWA and SWB are in contact with the conductor pads 28.

The operation of sensing a handling direction of the related art rotary switch will now be described.

If a user rotates the rotary disc 24 in a predetermined direction, the switches SWA and SWB are in contact with the conductor pads 28 of the fixed disc 22. As a result, as shown in FIG. 3, output pulses 'PA' and 'PB' are generated by the pulse generator and then output through each switch.

At this time, since the switches SWA and SWB have a fixed relation position, as shown in FIG. 3, the output pulse 'PA' is generated by rotation of the rotary disc 24. Then, the output pulse 'PB' is generated at a time difference 't1–t2' relative to the user's rotary disc handling speed.

Meanwhile, if the user rotates the rotary disc 24 in a direction opposite to the predetermined direction, the output pulse 'PB' is generated and then the output pulse 'PA' is generated at a time difference relative to the user's rotary disc handling speed. Therefore, it is possible to sense the user's handling direction according to the phase difference between the output pulses 'PA' and 'PB'.

The related art rotary switch has several problems.

First, in sensing the handling direction, the rotary switch and its linked circuits have complicated circuit configurations. Furthermore, since the handling direction of the rotary switch is sensed by the phase of the pulses, it is likely that error operation may occur due to delay of the phase.

SUMMARY OF THE INVENTION

Accordingly, the present invention is directed to an apparatus and method for sensing a rotary switch handling direction of a monitor that substantially obviates one or more problems due to limitations and disadvantages of the related art.

An object of the present invention is to provide an apparatus and method for sensing a rotary switch handling direction of a monitor in which a simple configuration can be obtained and accuracy in sensing a handling direction can be enhanced.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an apparatus for sensing a rotary switch handling direction of a monitor includes a rotary switch for outputting voltage levels varied correspondingly depending on a user's handling direction, and a microcomputer for storing the voltage levels output from the rotary switch and comparing the voltage levels with a previously stored voltage change/handling direction table to determine a handling direction of the rotary switch.

In another aspect of the present invention, in a method for sensing a rotary switch handling direction of a monitor having a rotary switch and a microcomputer, the rotary switch having variable output levels depending on a user's handling direction, the method includes the steps of successively reading out and storing, at a microcomputer, the voltage levels output from the rotary switch depending on the user's rotary switch handling direction for predetermined number of times, and comparing the stored voltage levels of the rotary switch, at the microcomputer, with a previously stored voltage change/handling direction table to sense a handling direction of the rotary switch.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings.

Figure 1:
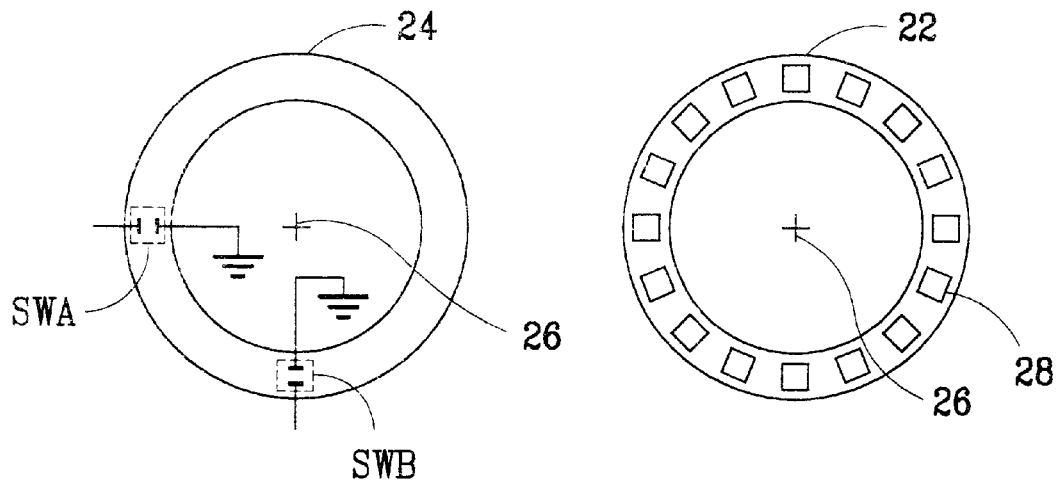
FIG. 1 is a diagram showing a structure of a related art rotary switch for adjusting a screen of a monitor.
Figure 2:
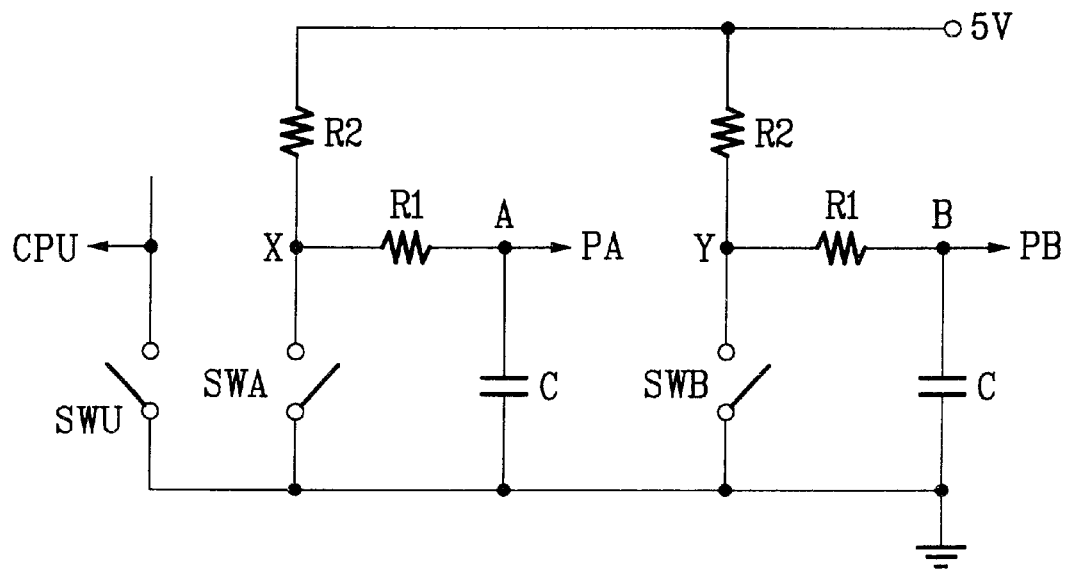
FIG. 2 is a circuit diagram showing a circuit configuration of FIG. 1.
Figure 3:
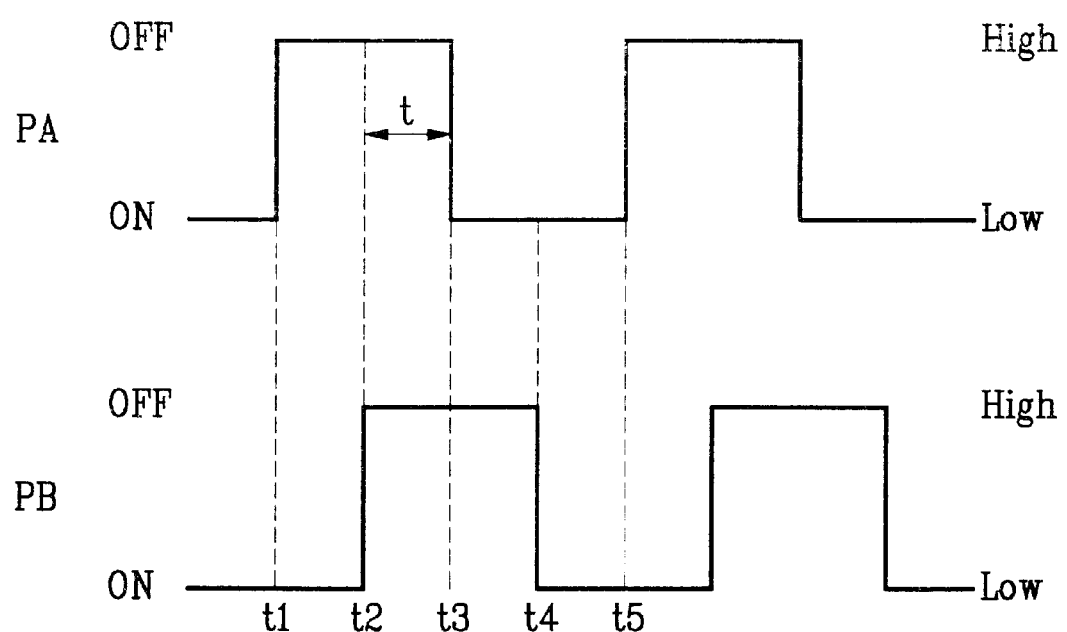
FIG. 3 is an output waveform of FIG. 2.
Figure 4:
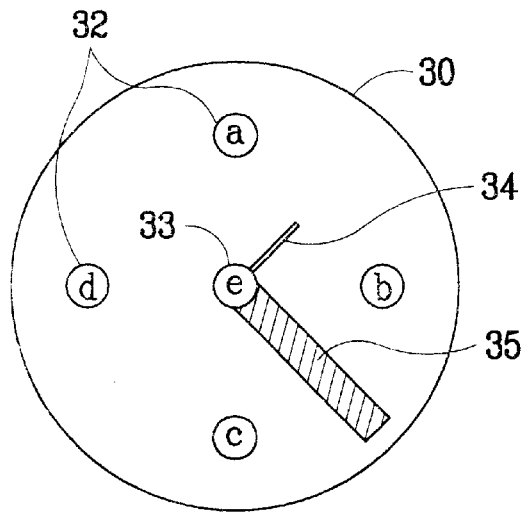
FIG. 4 is a diagram showing an apparatus for sensing a rotary switch handling direction of a monitor according to the present invention.

As shown in FIG. 4, an apparatus for sensing a rotary switch handling direction of a monitor according to the present invention includes a rotary switch 30 for outputting voltage levels varied correspondingly depending on a user's handling direction, and a microcomputer 40 for sensing a handling direction of the rotary switch 30 depending on the voltage levels output from the rotary switch 30.

In a circuit configuration of the apparatus, resistors R1~R4 are serially connected in turn between a power source terminal of 5 V and a ground terminal. A fixed contact 'a' is connected with a node between the resistor R1 and the power source terminal, a fixed contact 'b' between the resistor R1 and the resistor R2, a fixed contact 'c' between the resistor R2 and the resistor R3, and a fixed contact 'd' between the resistor R3 and the resistor R4. A detecting contact 34 is connected with the microcomputer 40.

Voltages having different levels are applied to the respective fixed contacts 'a', 'b', 'c', and 'd' in proportional to resistance values of corresponding voltage dividing resistors R1~R4. For example, since the fixed contact 'a' remains without passing through any resistor, 5 V is applied thereto. 4 V is applied to the fixed contact 'b', and 3 v is applied to the fixed contact 'c'.

Figure 5:
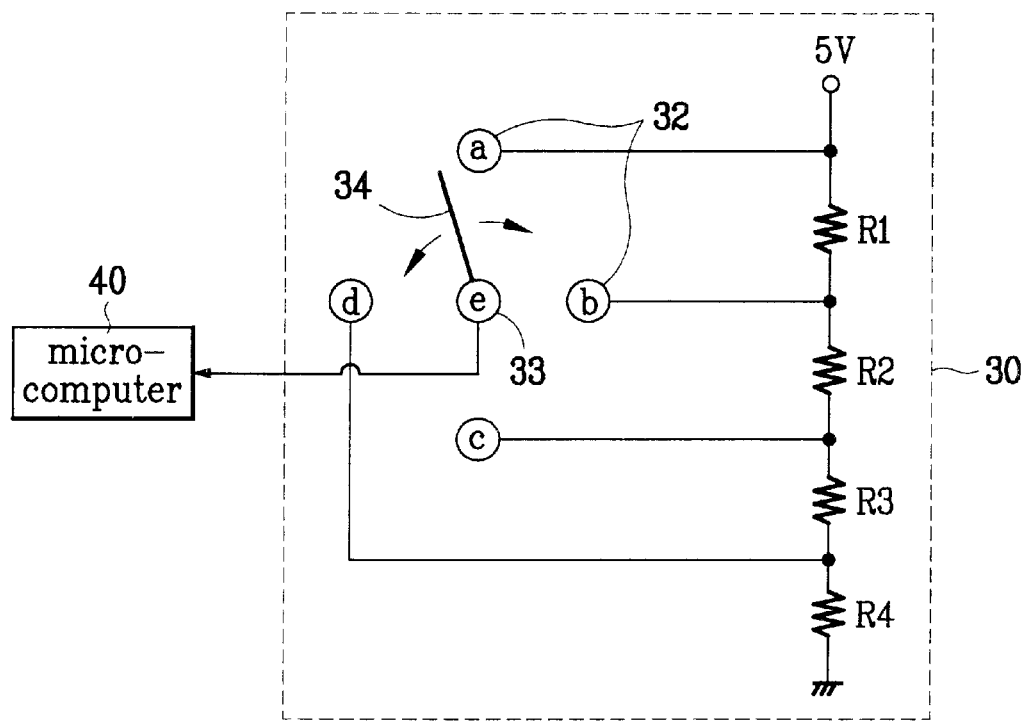
FIG. 5 is a diagram showing a configuration of a rotary switch of FIG. 4.

At this time, the rotary switch 30, as shown in FIG. 5, includes a plurality of fixed contacts 33 fixed in a round shape to maintain a predetermined interval and angle, a rotary shaft 33, a detecting contact 34 rotated around the rotary shaft 33 in accordance with a user's rotary switch handling and contacted with the fixed contacts 32, a shaft 35 for directly rotating the rotary shaft 33 in engagement with the user's rotary switch handling so as to rotate the detecting contact 34.

The operation of sensing the aforementioned rotary switch handling direction will be described below.

TABLE 1

| Fixed contact | a | b | c | d |
|---|---|---|---|---|
| Applying voltage (V) | 5 | 4 | 3 | 2 |

First, voltage values applied to the respective contacts are defined as Table 1.

The user rotates the rotary switch 30 to select a desired menu among screen adjusting menus displayed on the screen. Thus, the detecting contact 34 is rotated in a predetermined direction, i.e., a user's handling direction, by the operation of the shaft 35 mechanically engaged with the rotary shaft 33 within the rotary switch 30.

Figure 6:
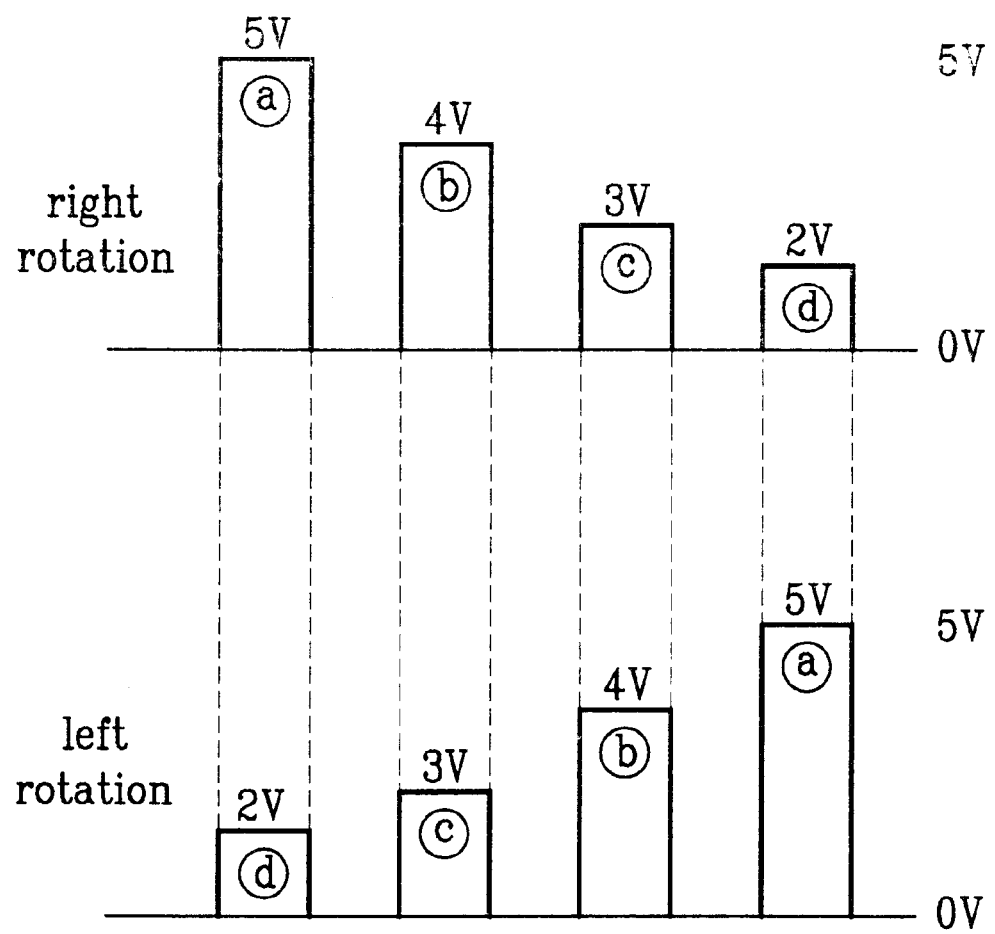
FIG. 6 is an output waveform of FIG. 5.

For example, if the user continues to rotate the rotary switch 30 in a right direction, as shown in FIG. 6, the voltage levels input to the microcomputer 40 through the detecting contact 34 are reduced in the order of 5 V→4 V→3 V→2 V and again returned to 5 V. These steps are repeated.

Meanwhile, if the user continues to rotate the rotary switch 30 in a left direction, as shown in FIG. 6, the voltage levels input to the microcomputer 40 through the detecting contact 34 are reduced in the order of 2 V→3 V→4 V→5 V and again returned to 2 V. These steps are repeated.

Accordingly, if the voltage levels are changed in such a way as '5→4', '4→3', '3→2', or '2→5', it is noted that the user has rotated the rotary switch 30 in a right direction. If the voltage levels are changed in such a way as '5→2', '2→3', '3→4', or '4→5', it is noted that the user has rotated the rotary switch 30 in a left direction.

TABLE 2

| First output of detecting contact | Second output of detecting contact | Handling direction |
|---|---|---|
| 5 | 4 | Right |
| 4 | 3 | Right |
| 3 | 2 | Right |
| 2 | 5 | Right |
| 5 | 2 | Left |
| 2 | 3 | Left |
| 3 | 4 | Left |
| 4 | 5 | Left |

In the present invention, a table based on the principle of a handling direction according to the voltage change, e.g., a voltage change/handling direction table as shown in Table 2, is stored in a memory or external memory of the microcomputer 40.

Subsequently, successive outputs of the detecting contact 34 are read out twice and then stored. That is to say, a first output of the detecting contact 34 is read out and then stored in a first memory region and a second output of the detecting contact 34 is read out and then stored in a second memory region.

The first and second outputs of the detecting contact 34 are respectively compared with the voltage change/handling direction table so that a handling direction of the rotary switch 30 is sensed.

Once the handling direction of the rotary switch 30 is sensed, the microcomputer 40 moves to a menu in a corresponding direction among the screen adjusting menus displayed on the screen so that a result selected by the user is displayed.

In the embodiment of the present invention, while four fixed contacts have been described, it is apparent that the number of the fixed contacts can be increased and the handling direction of the rotary switch can accurately be sensed if a difference exists in a predetermined voltage level applied to the respective fixed contacts, e.g., a voltage of 0.5 V or greater (minimum voltage level to prevent recognition error of the microcomputer).

As aforementioned, the apparatus and method for sensing a rotary switch handling direction of a monitor has the following advantages.

Since the handling direction is sensed by the voltage level difference for the respective contacts, it is possible to exactly sense the handling direction and to relatively obtain a simple configuration.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method of determining a direction of a rotary switch for a monitor, comprising the steps of:

storing a look-up table in a memory, said table including respective reference data that correspond to rotational directions of a rotary switch;

manually rotating a rotary switch knob rigidly fixed to a voltage level detector, which rotatably moves to a plurality of fixed contacts in sequence in response to said switch knob rotation, wherein a particular voltage level is applied to each of said fixed contacts;

sequentially detecting respective voltage levels of at least two contacts adjacently arranged;

receiving said sequentially detected voltage levels from said rotary switch through a single input line; and looking up a rotational direction of said rotary switch from said memory based on said received voltage levels of said adjacently arranged contacts.

2. The method of claim 1, wherein said reference data includes first and second pluralities of combinations of at least two sequential voltage levels that correspond to a clockwise direction and a counterclockwise direction, respectively.

3. The method of claim 1, wherein each of said plurality of fixed contacts is connected to a respective one of a plurality of nodes that are alternately arranged with a plurality of resistors being serially connected between a power source and a ground terminal.

4. The method of claim 3, wherein said particular voltage level applied is determined by a number of said plurality of resistors between each of said fixed contacts and said power source terminal or by resistances of said plurality of resistors.

* * * * *